(12) United States Patent
Johnson et al.

(10) Patent No.: US 7,019,253 B2
(45) Date of Patent: Mar. 28, 2006

(54) ELECTRICALLY CONTROLLED PLASMA UNIFORMITY IN A HIGH DENSITY PLASMA SOURCE

(75) Inventors: Wayne L. Johnson, Phoenix, AZ (US); Thomas H. Windhorn, Mesa, AZ (US); Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 374 days.

(21) Appl. No.: 10/229,036

(22) Filed: Aug. 28, 2002

(65) Prior Publication Data

US 2003/0006019 A1 Jan. 9, 2003

Related U.S. Application Data

(63) Continuation of application No. PCT/US01/06239, filed on Feb. 28, 2001.
(60) Provisional application No. 60/186,279, filed on Mar. 1, 2000.

(51) Int. Cl.
   *B23K 10/00* (2006.01)

(52) U.S. Cl. .............. 219/121.36; 219/121.43; 219/121.41; 118/723 I; 315/111.51; 156/345.48

(58) Field of Classification Search .............. 219/121.4, 219/121.41, 121.43, 121.44, 121.57; 118/723 R, 118/723 I; 315/111.51; 156/345.48, 345.44; 204/198.36, 198.37
See application file for complete search history.

(56) References Cited

U.S. PATENT DOCUMENTS

| 5,241,245 | A | | 8/1993 | Barnes et al. |
|---|---|---|---|---|
| 5,683,548 | A | | 11/1997 | Hartig et al. |
| 5,897,713 | A | * | 4/1999 | Tomioka et al. ........ 118/723 I |
| 5,907,221 | A | | 5/1999 | Sato et al. |
| 5,935,373 | A | | 8/1999 | Koshimizu |
| 6,077,384 | A | * | 6/2000 | Collins et al. ........ 156/345.29 |
| 6,312,556 | B1 | * | 11/2001 | Donohoe et al. ...... 156/345.28 |
| 6,518,190 | B1 | * | 2/2003 | Lill et al. ................ 438/710 |
| 2001/0022158 | A1 | * | 9/2001 | Brcka ..................... 118/723 I |
| 2001/0042594 | A1 | * | 11/2001 | Shamouilian et al. ...... 156/345 |
| 2001/0047760 | A1 | * | 12/2001 | Moslehi .................. 118/723 I |

FOREIGN PATENT DOCUMENTS

WO    WO 98/56027    12/1998

* cited by examiner

*Primary Examiner*—Mark Paschall
(74) *Attorney, Agent, or Firm*—Pillsbury Winthrop Shaw Pittman LLP

(57) ABSTRACT

Apparatus including a chamber and a coil system for converting a field-generating current into a RF magnetic field in the chamber when the chamber contains an ionized gas which interacts with the RF magnetic field to create a plasma. The plasma is contained within a cylindrical region enclosed by the chamber, which region has a longitudinal center axis, and the region is considered to be made up of a plurality of annular zones concentric with the center axis and disposed at respectively different distances from the center axis. The coil system is composed of: a plurality of individual coils each positioned and dimensioned to produce a RF magnetic field which predominantly influences a respective annular zone.

20 Claims, 3 Drawing Sheets

ELECTRICALLY CONTROLLED PLASMA UNIFORMITY IN A HIGH DENSITY PLASMA SOURCE

This application is a continuation application of International Application No. PCT/US01/06239, filed Feb. 28, 2001 and derives the benefit of U.S. Provisional application 60/186,279, filed Mar. 1, 2000, the contents of both of which are incorporated herein by reference.

BACKGROUND OF THE INVENTION

The present invention relates to the generation of a plasma in a processing chamber, and particularly the generation of an inductively coupled high density plasma in a chamber for performing deposition and etching processes.

Inductively coupled high density plasmas are widely used in connection with processing operations that involve the deposition of layers on, or the etching away of layers from, a substrate, such as a semiconductor wafer, in the course of integrated circuit fabrication.

Apparatus of this type includes a processing chamber whose interior is maintained at a low pressure and into which a substrate, such as a semiconductor wafer, is introduced. The processing chamber is typically surrounded by coils which are supplied with a radio frequency (RF) current that results in the generation of RF magnetic fields within the processing chamber. The RF magnetic fields generate RF electric fields that accelerate electrons and the accelerated electrons act to ionize atoms and molecules. When an ionizable process material is introduced into the chamber, molecules of that material are ionized in the RF magnetic field to create a plasma. Ions within the plasma are directed at a surface of the substrate to effect either deposition of a layer on the substrate surface or etching of a layer of material from the substrate surface. Electric fields established within the processing chamber propel ions within the plasma toward and into the substrate surface. The plasma also changes the input gas in a functional system to make it more reactive. The degree of reactivity is dependent upon the density of the plasma through which the molecules travel on their way to the substrate and on the electron energy distribution of the electrons.

In virtually all processing operations of this type, it is desired to control the ion density across the surface of the substrate. Often, the action performed on the substrate should be as uniform as possible across the substrate surface, i.e. the deposited layer or the material etched from the substrate surface should have as uniform a thickness as possible. This thickness uniformity is dependent to a substantial degree on the uniformity of the electric field density and the uniformity of the plasma density in planes parallel to the substrate surface, i.e. in planes perpendicular to the longitudinal axis of the processing chamber.

A variety of coil configurations have been proposed for the purpose of controlling the RF magnetic field produced by the coils. While many of these configurations are capable of producing plasma of a reasonably uniform density, the configurations proposed to date cannot create the conditions necessary to meet anticipated future demands.

BRIEF SUMMARY OF THE INVENTION

The present invention is embodied in apparatus for generating a plasma, the apparatus comprising: a plasma chamber containing a gas, the chamber enclosing a cylindrical region which has a longitudinal center axis and having two axial ends that are spaced apart along the axis; and a coil system for converting a field-generating current into a RF magnetic field in the chamber to interact with gas in order to sustain a plasma within the cylindrical region, being composed of a plurality of annular zones concentric with the center axis and disposed at respectively different distances from the center axis, wherein: the coil system comprises a plurality of individual coils each positioned and dimensioned to produce a RF magnetic field which predominantly influences a respective annular zone of the cylindrical region; and the chamber is shaped to have a continuous surface that extends past each of the individual coils.

As used herein with reference to the shape of the chamber, a "continuous surface" is one that may lie along one or several flat planes or one or several curved planes, but in each case does not have any sections that protrude or project between individual coils, or past a flat or curved plane containing the ends of the individual coils.

The invention further involves the optional use of an electrostatic shield in the above-described geometry. This can decrease the amount of capacitive coupling between the coils and the plasma, and improve the quality of the plasma drive.

DETAILED DESCRIPTION OF THE INVENTION

Figure 1:
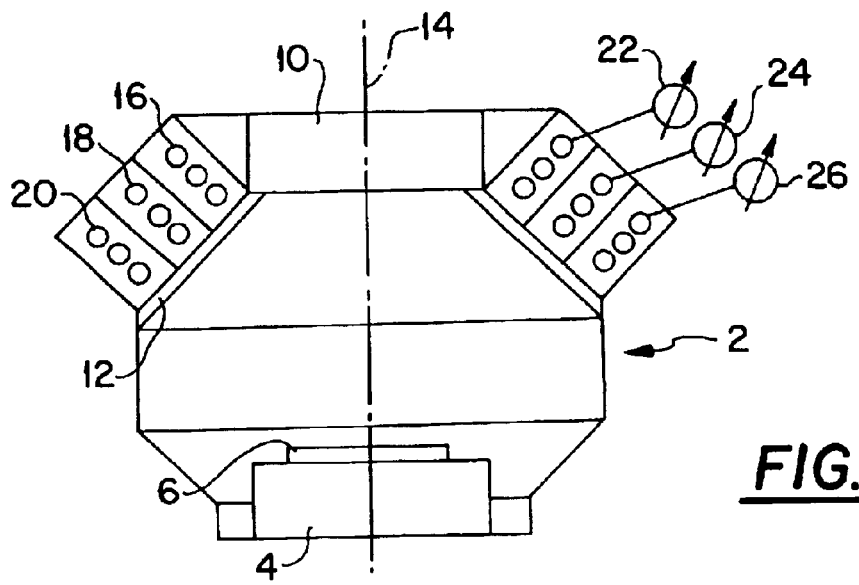
FIG. 1 is a simplified, pictorial, elevational view of apparatus constructed according to a first embodiment of the present invention.

FIG. 1 is a simplified illustration of a system which includes a process chamber 2 having a lower extremity which is equipped with a substrate support 4. Support 4 provides a supporting surface within chamber 2 for a substrate 6 that is to undergo a fabrication process. This support is also RF biased to provide a negative voltage to attract ions. The wafer may be affixed to this support by an electrostatic chuck to improve thermal transport from the wafer to the chuck. The surface of the chuck around the wafer and electrostatic chuck will be covered with an insulating or resistive material to avoid sputter damage of the chuck and prevent chuck body material from contaminating the wafer. The chamber may be employed to perform processes such as deposition of a coating on, or the etching of a surface layer or selected portions of a surface layer from, substrate 6.

In the system under consideration, such a process is performed by introducing a process material into a chamber 2 and creating, as noted above, RF electric fields to accelerate electrons that ionize the process material to form a plasma. Ions in the plasma are directed to substrate 6 to perform the desired processing operation.

The process material may be constituted by a gas that will be introduced to the interior of chamber 2 via an injection assembly 10. The interior of chamber 2 is provided, at its upper extremity, with a process tube 12 that extends across injection assembly 10. Process gas can be injected from a variety of positions other than that illustrated. For example, gas can be injected via the spaces between coils, or from below the coils, or from support 4, or from within the dielectric material constituting process tube 12, or through the side wall of process chamber 2.

In a system of the type here under consideration, it is common practice to create an inductively coupled plasma by delivering RF currents to inductive coils suitably positioned relative to process chamber 2. For example, it is common practice in the art to provide a coil around the top and/or vertical side of a process chamber, which coil has a vertical longitudinal axis 14 coaxial with the vertical longitudinal axis of the process chamber. Such a coil or coil assembly is preferably disposed outside of process chamber 2, but may be disposed within the process chamber.

In almost all processing operations which rely on a plasma, it is desirable that the action performed on the upper surface of substrate 6 be as controllable as possible. In other words, if the process involves depositing a layer on the substrate surface, it is usually desired that the thickness and composition of this layer have a high degree of uniformity, while it is usually desired that an etching operation have the effect of producing a uniform etching depth across the substrate surface.

Any process chamber can be tuned for a given process by proper selection of the physical shape of the chamber and plasma generation elements. A chamber which can be tuned to several processes sequentially while carrying out each process with the requisite uniformity over a wide range of process conditions would be of considerable value and would minimize chamber development cost.

It is known that the density of the plasma created within chamber 2 has a significant influence on the rate at which material is deposited on, or etched from, the upper surface of substrate 6 and that the uniformity of such deposition or etching operations is dependent on the radial uniformity of the plasma density, i.e. the uniformity of the plasma density in directions perpendicular to axis 14.

According to the present invention, the plasma density distribution within chamber 2 is controlled with great effectiveness by the provision of a plurality of field generating coils 16, 18 and 20 which are all wound concentrically with axis 14 and have respectively different horizontal spacings from axis 14. Thus, the average winding diameter of coil 16 is smaller than that of coil 18, while that of coil 18 is smaller than that of coil 20.

Each coil thus produces a RF magnetic field having a predominant influence on a different radially extending segment of the plasma. In other words, coil 16 will have a predominant influence on a portion of the plasma closer to axis 14, while the field produced by coil 20 will have a predominant influence on a portion of the plasma in the vicinity of the side wall of chamber 2 and the field produced by coil 18 will have a predominant influence on a portion of the plasma between the two previously mentioned portions.

In addition, coils 16, 18 and 20 have respectively different heights, inner coil 16 being the highest and outer coil 20 being the lowest. Thus, the cross-section of the source of the RF magnetic field created within chamber 2 decreases in diameter as the vertical distance from the plane defining the upper surface of substrate 6 increases.

In order to effectively control the plasma density within chamber 2, each coil 16, 18 and 20 is preferably driven by an individually controllable RF power source or by a single RF power source connected to each coil by a respective, individually adjustable power supply control device. By individually controlling the RF power supplied to each coil, a corresponding plasma density variation can be effected in each associated portion of the plasma. For example, when the power supply to upper coil 16 is increased, the plasma density in the region closest to axis 14 will be increased.

In the embodiment illustrated in FIG. 1, each of coils 16, 18 and 20 has one end connected to a respective individual power source 22, 24 and 26. The other end of each coil and the other side of each power source are connected to ground (not shown). Each power source 22, 24 and 26 may be of any conventional type and is preferably adjustable with respect to power level, frequency and phase.

Furthermore, in the embodiment illustrated in FIG. 1, each coil 16, 18, 20 is wound to have the form of a section of a cone which diverges upwardly.

Figure 2:
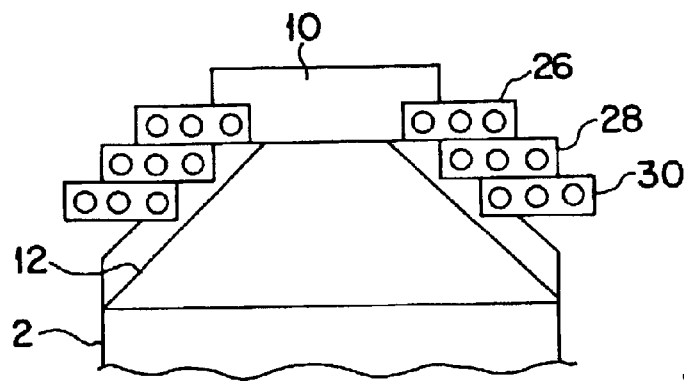
FIGS. 2, 3, 4, 5, 6 and 7 are views similar to that of FIG. 1, illustrating five further embodiments of the invention.

FIG. 2 illustrates a second embodiment of the invention which differs from the embodiment of FIG. 1 primarily with respect to the shape of the field generating coils. In this embodiment, each coil is a flat coil. However, as in the case of the embodiment of FIG. 1, the uppermost coil 26 has the smallest average diameter, while the lowermost coil 30 has the largest average diameter. Coils 26, 28 and 30 influence respective portions of the plasma in chamber 2 in the same manner as coils 16, 18 and 20 of the embodiment shown in FIG. 1.

Figure 3:
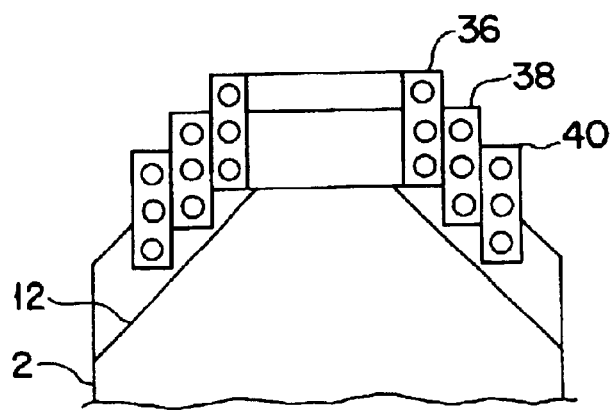

The embodiment shown in FIG. 3 differs from that of FIG. 1 in that the conical coils 16, 18 and 20 in FIG. 1 are replaced by cylindrical, or solenoidal, coils 36, 38 and 40. Here again, the uppermost coil 36 has the smallest diameter while the lowermost coil has the largest diameter and these coils influence the plasma in chamber 2 in the same manner as coils 16, 18 and 20 of FIG. 1.

Figure 4:
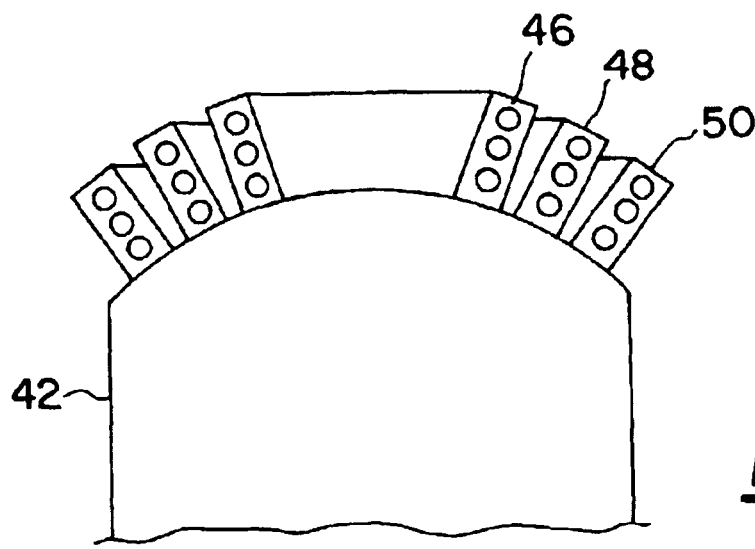

FIGS. 1, 2 and 3 each illustrate an arrangement of field generating coils mounted on an upper chamber part having a conical form. Embodiments of the invention may also utilize a chamber having a domed upper portion, such as chamber 42 shown in FIG. 4. In this embodiment, coils 46, 48 and 50 are mounted in a manner illustrated on the domed upper portion. Here again, as in the case of the previously described embodiments, coil 46 having the greatest average elevation is the innermost coil and coil 50 having the lowest average elevation is the outermost coil. Coils 46, 48 and 50 will be controlled in the same manner, and will produce the same effect, as coils 16, 18 and 20 of the embodiment shown in FIG. 1.

In the embodiments shown in FIGS. 1–4, the field generating coils are all located at the top of the processing chamber and are all arranged, as described above, so that the uppermost coil has the smallest average diameter. However, embodiments of the present invention can have the field generating coils located in proximity to the substrate and can be arranged so that the uppermost coil has the largest diameter.

Figure 5:
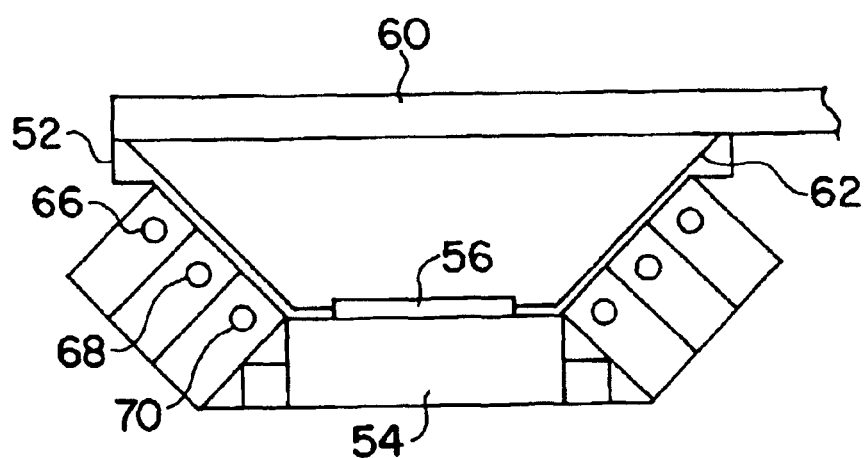

One example of such an arrangement is shown in FIG. 5, where a processing chamber 52 which is axially relatively compact is provided at its bottom with a substrate support 54 carrying a substrate 56, these elements being similar to elements 4 and 6 of the embodiment shown in FIG. 1. The top of processing chamber 52 is provided with an injection/pumping assembly 60 for injecting a process gas into the processing region enclosed by chamber 52 and for accessing a pump for establishing vacuum pressure levels within the chamber.

Chamber 52 has the form of an upwardly diverging conic frustum and the conical side wall of chamber 52 is covered by a process tube 62. The three coil assemblies 66, 68 and 70 are mounted outside of chamber 52, adjacent the conical side wall thereof, and are covered by an electrostatic shield which extends parallel to the chamber side wall. In this embodiment, the uppermost coil 66 has the largest diameter, while the lowermost coil 70 has the smallest diameter.

It is believed that when a processing operation is performed with this embodiment, the power produced by the lowermost coil 70 will have a predominant influence on the plasma density in a region adjacent the longitudinal axis of chamber 52.

FIGS. 1–4 illustrate embodiments provided with multi-turn coils, while FIG. 5 illustrates an embodiment provided with single turn coils. It should be understood, however, that the coils of any one of the illustrated embodiments can be multi-turn coils or single turn coils. Moreover, in any one embodiment, one or more of the coils can be multi-turn coils and one or more can be single turn coils. In addition, in each illustrated embodiment, the coils can have a conical form, as shown in FIG. 1, or a planar form shown in FIG. 2, or a solenoidal form, as shown in FIG. 3.

Furthermore, in each of the illustrated embodiments, all of the coils interact only at the plasma and are essentially electrically isolated from one another. The coils in each embodiment can be resonant coils which are helical resonators all tuned to the same frequency and phase, or all tuned to the same frequency but having different phases, or each having an individually programmed time varying phase, or all tuned to respectively different frequencies. In the case of a helical resonator, one end thereof is grounded and the opposite end is open circuited. The resonator has a tap location typically located near the grounded end.

Each coil can also be a single turn coil that can be made resonant by loading it with a capacitor. The tap position is located at one end of the single turn/multiple turn coil and a variable capacitor to ground is located at the opposite end of the coil. The use of single turn coils enables a plurality of coils to be used to surround a smaller plasma region and enables improved spatial control.

In either case, the resonant helix or the resonant single turn coil can increase power coupling efficiency to the plasma during start-up conditions. This is an advantage over non-resonant coils. Furthermore, the single turn coil can further improve the power transfer efficiency by permitting a smaller plasma volume proximate to the substrate, i.e., by providing a shortened chamber. It also can allow for the use of several coils used to control the spatial uniformity of the plasma properties. An additional advantage to the use of a single turn coil with a variable capacitor to ground is that the match network may be removed.

Both of these coil arrangements have inherent advantages over the prior art.

Figure 6:
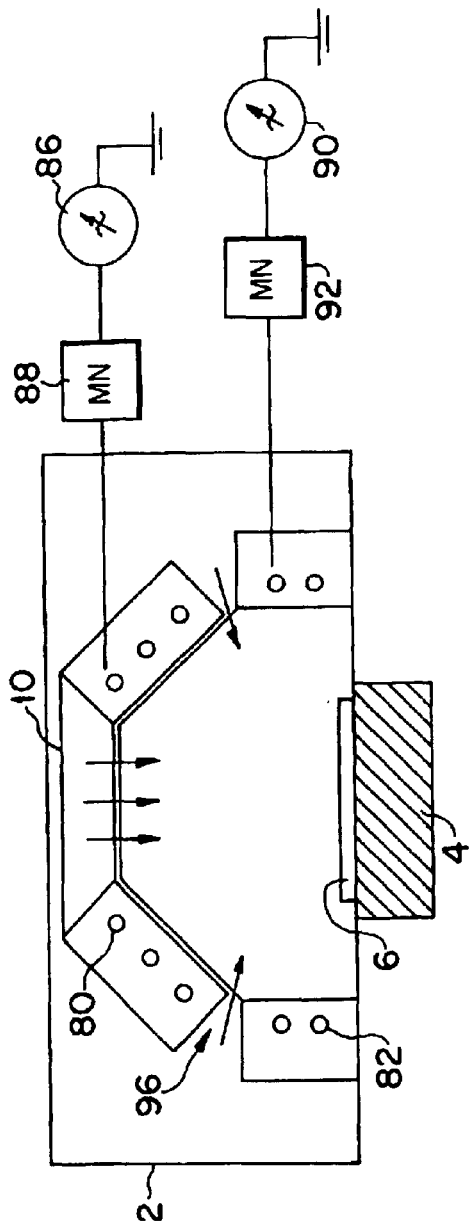

FIG. 6 illustrates a further embodiment of the invention in which two coils are separately driven, possibly at different frequencies and/or phases and/or power levels, and process gas is introduced from various locations surrounding the plasma region. Specifically, this embodiment has two annular coils 80 and 82, each wound about the vertical axis of chamber 2. Coil 80 is wound on an upwardly tapering frustoconical surface and coil 82 is wound on a cylindrical surface. Coil 80 is connected to a first RF power source 86 via a match network 88; coil 82 is connected to a second RF power source 90 via a match network 92. Each power source is individually controllable with respect to frequency and/or phase and/or power level. To cite one example, one of sources 80, 82 can be controlled to provide power at a frequency which is twice that provided by the other power source. Process gas may be supplied to the plasma region via injection assembly 10 and/or via conduits or nozzles disposed in annular region 96 between coils 80 and 82. The above-described features shown in FIG. 6 can be applied to other embodiments, including those shown in FIGS. 1–5, where process gas can be introduced between any pair of coils.

Any embodiment of the invention, including those described with reference to FIGS. 1 to 6, may be adapted to accept feedback from an in-situ monitoring system which includes a means to monitor the plasma optical emission above the wafer and/or the spatial distribution of the ongoing etch or deposition rate.

Figure 7:
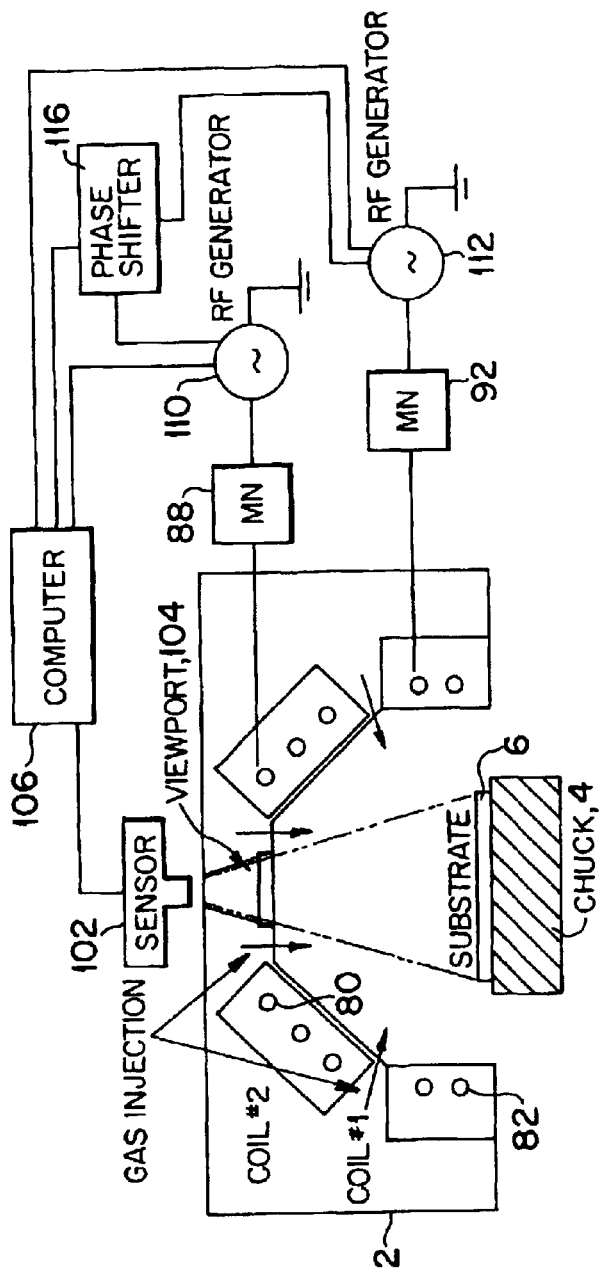

FIG. 7 shows an embodiment of the invention provided with one suitable monitoring system. This system includes a sensor 102 mounted atop the multi-coil plasma reactor above a viewport via which sensor 102 has a field of view encompassing wafer 6 as shown. The output of sensor 102 is fed to a computer 106 which, in turn, transmits an electronic signal to each of two RF generators 110 and 112 to control and vary RF power delivered to an individual coil 80, 82. In addition, a phase shifter 116 is connected to computer 106 and to RF generators 110 and 112 to control the relative phase between the RF power delivered to each coil in response to control signals from computer 106. Sensor 102 may be a LES1200 Thin Film Metrology Sensor marketed by Leybold Inficon, capable of in-situ measurement of thin film etch or deposition rate, rate uniformity, endpoint, endpoint uniformity and plasma optical emission over the entire wafer.

In one mode of operation, sensor 102 may be utilized to monitor the spatial distribution of the etch rate. For example, if components 102–116 were incorporated in the embodiment of FIG. 1 and the etch rate is found to be lower near the periphery of wafer 6, then the RF power delivered to coil 20 can be increased. Alternatively, if the etch rate is lower at the wafer center, then the RF power delivered to coil 16 may be increased. In essence, the RF power delivered to regions of the processing plasma is adjusted to compensate for any spatial non-uniformity in the etch rate. Prior to wafer processing, a blanket wafer may be used to tune the coil power distribution formula, i.e. amplitude, phase, and frequency. Furthermore, the plasma optical emission for various species may be monitored in order to optimize the etch or deposition chemistry. Similarly, the RF power delivered to independent coils and/or delivered to independent coils at different frequencies with relative phase differences may be adjusted to optimize the plasma chemistry.

Each coil of any one of the disclosed embodiments can be driven by means of a free running oscillator associated with a fixed matched network to couple to the coil when no plasma is being created. The oscillator can produce a RF current which varies in frequency to accommodate changes in impedance that occur with plasma ignition and with changes in plasma density. The free running oscillator can be of a tube type, as disclosed in pending Provisional application Ser. No. 60/143,548, filed on Jul. 13, 1999, entitled RADIO FREQUENCY POWER SOURCE FOR GENERATING AN INDUCTIVELY COUPLED PLASMA, the contents of which are incorporated herein by reference, or can be a solid state device that is located in physical proximity to the associated coil, or a remotely located wide frequency amplifier associated with the sensor disposed at the associated coil to control the frequency of the current supplied to the coil in a manner which matches existing conditions.

Other drive configurations that can be employed include: those using a variable frequency power supply whose frequency is determined by a phase and magnitude detector in a fixed element match network, which is already known, per se, and is disclosed in U.S. Pat. No. 5,688,357; those using phase locked power supplies for all coils; and those using variable frequency or multiple frequency power supplies that allow each coil to be driven with a mixture of frequencies. The latter configuration allows the electron temperature as well as the plasma density to be tuned as a function of coil radius. Coil arrangements of the latter type are disclosed in a pending Provisional Application No. 60/182,549 by Johnson, filed on Feb. 15, 2000, entitled ACTIVE CONTROL OF ELECTRON TEMPERATURE IN AN ELECTROSTATICALLY SHIELDED RADIO FREQUENCY PLASMA SOURCE.

Apart from the coil arrangement disclosed and illustrated herein, a process chamber for practicing the present invention will be constructed in accordance with conventional practices in this art.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. Apparatus for generating a plasma, said apparatus comprising:
    a plasma chamber containing a gas, said chamber enclosing a cylindrical region which has a longitudinal center axis and having two axial ends that are spared apart along the axis; and
    a coil system for converting a field-generating current into a RF magnetic field in the chamber to interact with gas in order to sustain a plasma within the cylindrical region, being composed of a plurality of annular zones concentric with the center axis and disposed at respectively different distances from the center axis, wherein:
        said coil system comprises a plurality of individual coils each positioned and dimensioned to produce a RF magnetic field which predominantly influences a respective annular zone of the cylindrical region;
        said chamber is shaped to have a continuous surface that extends past the end of each of said individual coils; and
        each of said coils is a helical resonant coil.

2. The apparatus of claim 1 wherein each of said individual coils has a respectively different mean diameter.

3. The apparatus of claim 2 wherein each of said individual coils is a multiturn coil.

4. The apparatus of claim 3 wherein at least one of said individual coils is a flat coil having turns which lie on a common plane that is perpendicular to the center axis.

5. The apparatus of claim 3 wherein at least one of said coils is a conical coil having turns which lie on a plane that defines a conical surface.

6. The apparatus of claim 3 wherein at least one of said individual coils is a cylindrical coil having turns which lie on a plane that defines a cylindrical surface.

7. The apparatus of claim 1 wherein each of said coils has a first end which is grounded and a second end which is open circuited.

8. The apparatus of claim 1 wherein all of said coils are tuned to be resonant at the same frequency.

9. The apparatus of claim 1 wherein all of said coils are tuned to be resonant at respectively different frequencies.

10. The apparatus of claim 2 wherein said coils are spaced apart from one another in a direction along the center axis.

11. The apparatus of claim 2 wherein each of said coils is a single turn coil.

12. The apparatus of claim 11 further comprising a plurality of capacitors each connected between one end of a respective coil and a ground point.

13. The apparatus of claim 12 wherein each of said capacitors is a variable capacitor.

14. The apparatus of claim 11 wherein said coils are spaced apart from one another in a direction along the center axis.

15. The apparatus of claim 1 in combination with means for applying an individually controlled field generation voltage to each of said coils.

16. The apparatus of claim 1 further comprising means connected to said coils for applying an individually controlled field generating voltage to each of said coils.

17. The apparatus of claim 1, further comprising means for introducing the gas into said chamber, said means being located for introducing all of the gas at a location that is enclosed by all of said individual coils.

18. The apparatus of claim 7, further comprising a tap positioned between the first end and the second end.

19. Apparatus for generating a plasma, said apparatus comprising:
    a plasma chamber containing a gas, said chamber enclosing a cylindrical region which has a longitudinal center axis and having two axial ends that are spaced apart along the axis; and
    a coil system for converting a field-generating current into a RF magnetic field in the chamber to interact with gas in order to sustain a plasma within the cylindrical region, being composed of a plurality of annular zones concentric with the center axis and disposed at respectively different distances from the center axis, wherein:
        said coil system comprises a plurality of individual coils each positioned and dimensioned to produce a RF magnetic field which predominantly influences a respective annular zone of the cylindrical region;
        each of said coils is a helical resonant coil; and
        said apparatus further comprises means for introducing the gas into said chamber, said means being located for introducing all of the gas at a location that is enclosed by all of said individual coils.

20. The apparatus of claim 18, wherein the tap is positioned closer to the first end than the second end.

* * * * *